(12) United States Patent
Jo et al.

(10) Patent No.: US 8,592,952 B2
(45) Date of Patent: Nov. 26, 2013

(54) SEMICONDUCTOR CHIP AND SEMICONDUCTOR PACKAGE WITH STACK CHIP STRUCTURE

(75) Inventors: Seung Hee Jo, Seongnam-si (KR); Seong Cheol Kim, Anseong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 233 days.

(21) Appl. No.: 13/096,338

(22) Filed: Apr. 28, 2011

(65) Prior Publication Data

US 2011/0291246 A1 Dec. 1, 2011

(30) Foreign Application Priority Data

May 31, 2010 (KR) .......................... 10-2010-0051276

(51) Int. Cl.
*H01L 29/40* (2006.01)

(52) U.S. Cl.
USPC .... 257/621; 257/686; 257/774; 257/E23.003; 438/455; 438/456; 438/459; 438/690

(58) Field of Classification Search
USPC .......... 257/621, 686, 774, 777, 787, E23.003; 438/455–459, 690
See application file for complete search history.

(56) References Cited

U.S. PATENT DOCUMENTS

| 7,564,118 | B2 | 7/2009 | Pogge et al. |
| 7,696,064 | B2 | 4/2010 | Gan et al. |
| 2006/0234405 | A1 | 10/2006 | Best |
| 2009/0200662 | A1* | 8/2009 | Ng et al. ........................ 257/723 |
| 2010/0264551 | A1 | 10/2010 | Farooq et al. |

FOREIGN PATENT DOCUMENTS

| JP | 2005026481 A | | 1/2005 |
| JP | 2009004622 | * | 1/2009 |
| JP | 2009004622 A | | 1/2009 |
| KR | 1020090030108 A | | 3/2009 |

* cited by examiner

*Primary Examiner* — Mark A Laurenzi
(74) *Attorney, Agent, or Firm* — William Park & Associates Patent Ltd.

(57) ABSTRACT

A semiconductor chip and semiconductor package with stack chip structure include align patterns. The align patterns are formed of magnetic materials having opposite polarities on the top and bottom of the semiconductor chip. Thus, when the plurality of chips are stacked on the substrate in order for the packaging, the semiconductor chips may be exactly aligned by the magnetic force between the align patterns of the vertically stacked chips. The semiconductor package includes a plurality of stacked semiconductor chips and a filling material. Each of the stacked semiconductor chips includes a semiconductor substrate having a first surface and a second surface, wherein a circuit pattern such as a bonding pad is formed on the first surface, and a first align pattern formed on the first surface of the semiconductor substrate, wherein the first align pattern is formed of a magnetic material.

15 Claims, 8 Drawing Sheets

SEMICONDUCTOR CHIP AND SEMICONDUCTOR PACKAGE WITH STACK
CHIP STRUCTURE

CROSS-REFERENCES TO RELATED APPLICATIONS

The present application claims priority under 35 U.S.C 119(a) to Korean Application No. 10-2010-0051276, filed on May 31, 2010, in the Korean intellectual property Office, which is incorporated herein by reference in its entirety set forth in full.

BACKGROUND

Exemplary embodiments of the present invention relate to a semiconductor package, and more particularly, to a semiconductor chip, which is applicable to a stack chip package, and a semiconductor package having a stack chip structure.

As the demands for small-sized, high-performance and mobile electronic products recently increase, ultra-small high-capacity semiconductor memory devices are increasingly demanded. In general, the storage capacity of the semiconductor memory device may increase by a method of increasing the integration degree of a semiconductor chip, or a method of mounting and assembling a plurality of semiconductor chips within a single semiconductor package. While the former method requires a lot of effort, capital, and time, the latter method can easily increase the storage capacity of the semiconductor memory by changing a packaging method. In addition, the latter method is very advantageous in terms of a necessary capital, research and development effort, and development time, as compared to the former method. Hence, semiconductor memory manufacturers are making many efforts to increase the storage capacity of the semiconductor memory device through a multi chip package which mounts a plurality of semiconductor chips within a single semiconductor package.

Examples of the method of mounting the plurality of semiconductor chips within the single semiconductor package include a method of mounting semiconductor chips horizontally, and a method of mounting semiconductor chips vertically. However, due to characteristics of electronic products seeking a miniaturization, most semiconductor memory manufacturers prefer a stack type multi chip package in which semiconductor chips are stacked vertically.

A stack chip package technique can reduce a manufacturing cost of a package due to a simplified process and is advantageous to mass production. However, the stack chip package technique may have a disadvantage in that an interconnection space for internal electrical connection of the package is insufficient due to increase in the number and size of stacked chips. That is, in such a state that a plurality of chips are attached to chip attachment regions of a substrate, a known stack chip package is manufactured in a structure in which a bonding wire of each chip and a conductive circuit pattern of a substrate are electrically connected by a wire. Thus, a space for wire bonding is required, and a circuit pattern area for wire connection is required. Consequently, a size of a semiconductor package may increase.

Considering these points, a package structure using a through-silicon via (TSV) has been proposed as an example of a stack package. Such a package is manufactured by forming TSVs within chips at a wafer level and coupling the chips physically and electrically in a vertical direction by the TSVs. A known manufacturing method will be described below.

Figure 1:
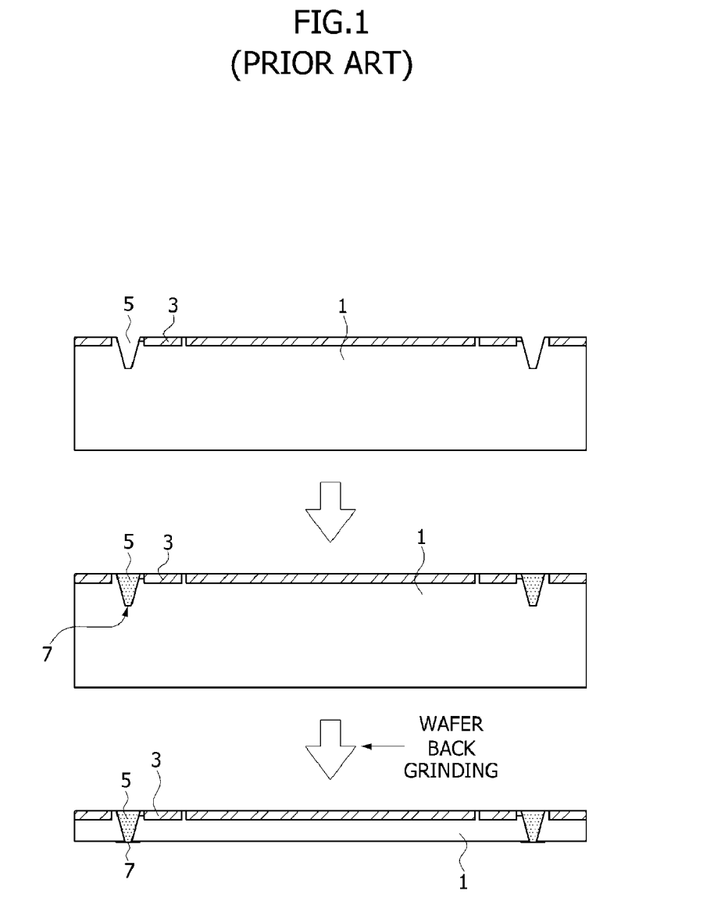
FIG. 1 illustrates a process of forming a known TSV.

FIG. 1 illustrates a process of forming a TSV. Referring to FIG. 1, vertical holes 5 are formed in regions adjacent to bonding pads 3 of each chip at a wafer (1) level, and an insulation layer (not shown) is formed on the surface of the vertical holes 5. Next, a seed metal layer is formed on the insulation layer. TSVs are formed by filling the vertical holes 5 with an electrolyte material, that is, a conductive metal 7, through an electroplating process.

A back grinding process is performed on the back side of the wafer to expose the conductive metal 7 filling the TSVs. The wafer is sawed into individual chips. Two or more chips are vertically stacked on the substrate so that signals can be transmitted and received through the conductive metal 7 of the TSVs. The top surface of the substrate, including the stacked chips, is molded, and solder balls are mounted on the bottom surface of the substrate. In this manner, the stack package may be manufactured.

When the chips with TSVs are stacked on the substrate, the individual chips are moved onto the substrate, for example, by a manufacturing equipment having a suction tool. Therefore, the align accuracy of the TSVs may become lowered. If warpage of the substrate occurs, it is more difficult to exactly align the TSVs. IF misalignment occurs between the TSVs or warpage of the substrate occurs, the conductive metals for transmitting and receiving signal may be broken or electrically shorted. Consequently, the chips may not operate normally.

SUMMARY

An embodiment of the present invention is directed to a semiconductor chip and a semiconductor package having a stack chip structure, which can improve the reliability of a device by reduce/minimize an occurrence of misalignment between chips when a plurality of semiconductor chips are stacked.

In an exemplary embodiment, a semiconductor chip includes a semiconductor substrate having a first surface and a second surface, wherein a circuit pattern such as a bonding pad is formed on the first surface, and a first align pattern formed on the first surface of the semiconductor substrate, wherein the first align pattern is formed of a magnetic material.

In another exemplary embodiment, a semiconductor package includes a plurality of stacked semiconductor chips, and a filling material filling a gap between the semiconductor chips. Each of the plurality of stacked semiconductor chips includes a semiconductor substrate having a first surface and a second surface, wherein a circuit pattern including a bonding pad is formed on the first surface, and a first align pattern formed on the first surface of the semiconductor substrate, wherein the first align pattern is formed of a magnetic material.

In another exemplary embodiment, a semiconductor package includes a substrate including an interconnection, a plurality of stacked semiconductor chips, a filling material filling a gap between the semiconductor chips, and a molding agent formed on the substrate to cover the plurality of semiconductor chips. Each of the plurality of stacked semiconductor chips includes a semiconductor substrate having a first surface and a second surface, wherein a circuit pattern including a bonding pad is formed on the first surface, a first align pattern formed on the first surface, wherein the first align pattern is formed of a magnetic material, a second align pattern formed on the second surface in correspondence to the first align pattern, having an opposite polarity to the first align pattern, wherein the second align pattern is formed of a magnetic material, and a through-silicon via passing through the semiconductor substrate.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

As described above, a structure including a TSV in each semiconductor chip of a wafer has been proposed in order to implement a stack chip package. The TSV is electrically connected to a bonding pad within the semiconductor chip, and the semiconductor chips are physically and electrically connected in a vertical direction by the TSV. In this manner, a stack chip package is manufactured. Embodiments of the present invention are directed to a semiconductor chip and a semiconductor package structure, which can be usefully applied to manufacture such a stack chip package.

FIGS. 2A to 2D are cross-sectional views illustrating semiconductor chips including align patterns according to an exemplary embodiment of the present invention.

Figure 2A:
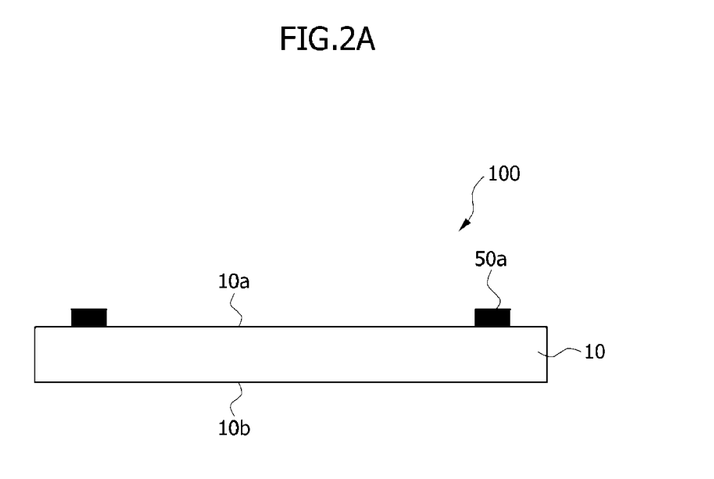
FIGS. 2A to 2D are cross-sectional views illustrating semiconductor chips including align patterns according to an exemplary embodiment of the present invention.
Figure 2B:
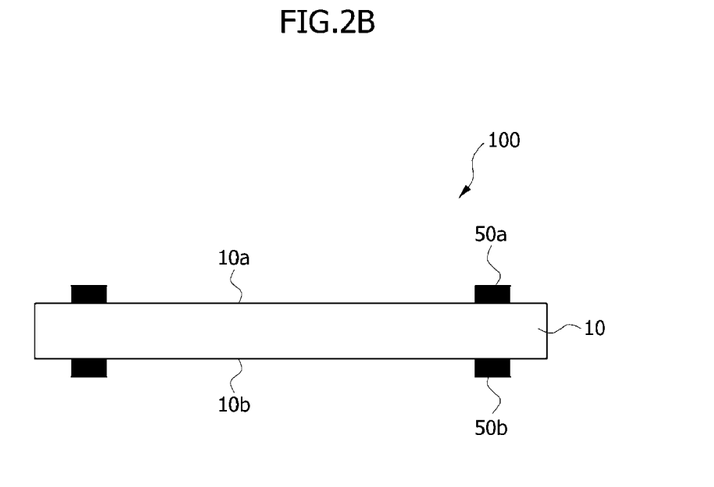
Figure 2C:
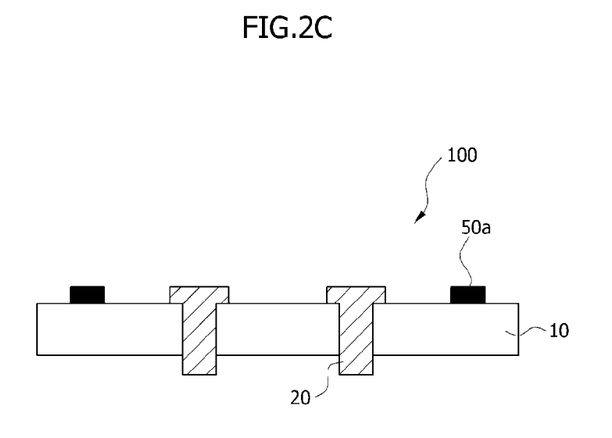
Figure 2D:
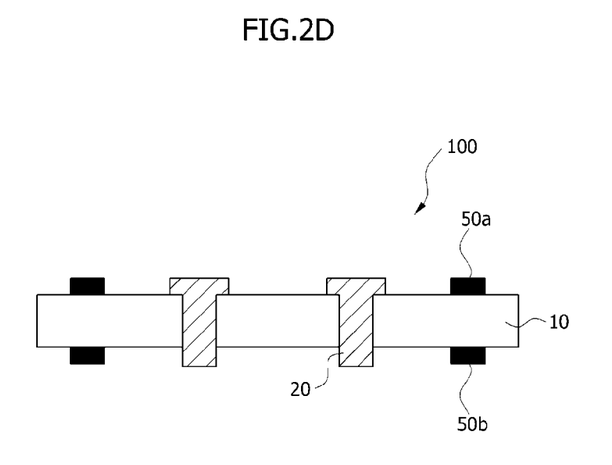

Each semiconductor chip 100 according to this exemplary embodiment of the present invention has a first surface 10a and a second surface 10b, and includes align patterns 50a formed on at least one of the two surfaces 10a and 10b. Here, the align patterns 50a may be formed of a magnetic material. FIGS. 2A and 2C illustrate examples in which the align patterns 50a are formed on only the first surface 10a, and FIGS. 2B and 2D illustrate examples in which align patterns 50a and 50b are formed to face each other on both the first surface 10a and the second surface 10b. The align patterns formed on the same surface are formed to be symmetrical to each other. In the case in which the align patterns 50a and 50b are formed on both of the first surface 10a and the second surface 10b, the align patterns formed on the opposite surfaces may be formed to have opposite polarities.

The semiconductor chips 100 may be chips having a general structure in which they are bonded by bumps or wires (see FIGS. 2A and 2B), or may be chips which include one or more TSVs 20 formed at regions adjacent to bonding pads (not shown) at a wafer level (see FIGS. 2C and 2D).

The align patterns 50a and 50b may be formed in regions where circuit patterns or TSVs are not formed, for example, scribe lanes.

In the case in which the align patterns 50a and 50b are formed on the surface of the semiconductor chip, a magnetic force is applied between the align patterns formed in the plurality of semiconductor chips which are vertically stacked at a subsequent packaging step. Hence, the semiconductor chips may be easily aligned. In addition, when a filling material fills a gap between the stacked semiconductor chips, a bonding force between the vertically stacked semiconductor chips may be reinforced by the magnetic force between the align patterns, and the occurrence of misalignment may decrease.

Figure 3:
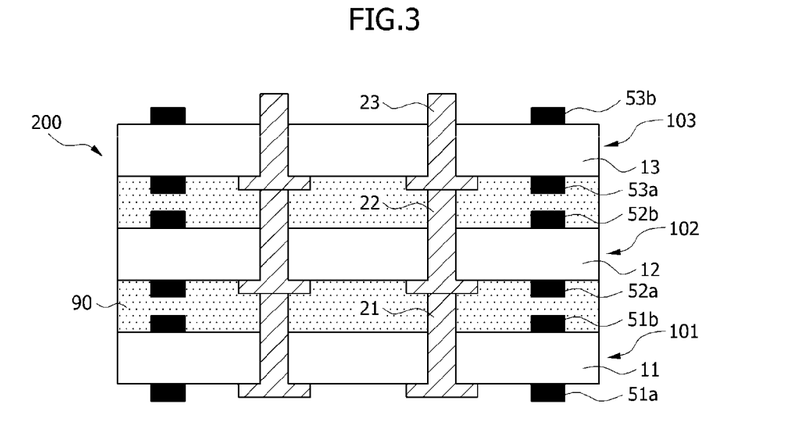
FIG. 3 is a cross-sectional view illustrating a semiconductor package having a stack chip structure according to another exemplary embodiment of the present invention.

FIG. 3 is a cross-sectional view illustrating a semiconductor package having a stack chip structure according to another exemplary embodiment of the present invention.

The semiconductor package 200 according to this exemplary embodiment of the present invention includes a plurality of semiconductor chips 101, 102 and 103 which are vertically stacked. Each of the semiconductor chips 101, 102 and 103 has a first surface and a second surface. Each of the semiconductor chips 101, 102 and 103 includes first align patterns which are formed on the first surface and/or the second surface, and formed of a magnetic material. A filling material 90 fills a gap between the semiconductor chips 101, 102 and 103. The filling material 90 may include a magnetic field shielding material in order that a magnetic field formed by the align patterns does not influence the driving of the package.

The semiconductor chips 101, 102 and 103 may include a portion of scribe lanes provided in order to cut them in units of chip at a wafer level. For example, align patterns 51a, 51b, 52a, 52b, 53a and 53b may be formed on the scribe lanes. In the case in which the align patterns 51a, 51b, 52a, 52b, 53a and 53b are formed on the scribe lanes, it is easy to cut and remove the align patterns when the magnetic field formed by the align patterns influences the driving of the chip.

A redistribution film or substrate including interconnection patterns for applying an external signal to the semiconductor chips may be further formed under the lowermost semiconductor chip among the plurality of semiconductor chips. In addition, third align patterns corresponding to the first or second align patterns of the lowermost semiconductor chip may be further formed on the substrate.

FIG. 3 illustrates an example in which the semiconductor chips include TSVs 21, 22 and 23 and the align patterns 51a, 51b, 52a, 52b, 53a and 53b are formed on both of the first surface and the second surface. However, as illustrated in FIG. 2A or 2C, the align patterns may be formed on only one surface. In addition, as illustrated in FIG. 2A or 2B, the semiconductor chips may not include the TSVs.

Figure 4:
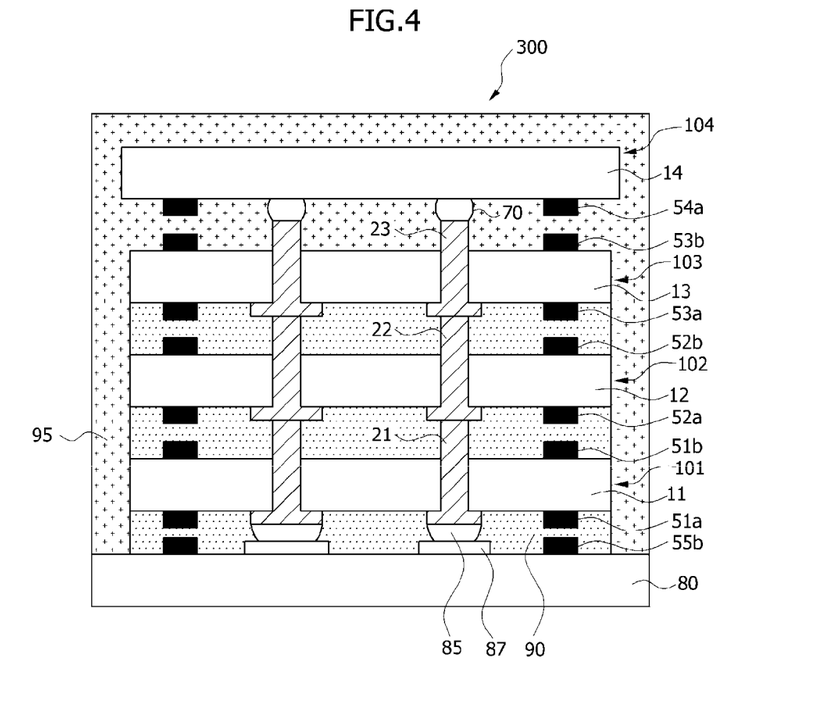
FIG. 4 is a cross-sectional view illustrating a semiconductor package having a stack chip structure according to another exemplary embodiment of the present invention.

FIG. 4 is a cross-sectional view illustrating a semiconductor package having a stack chip structure according to another exemplary embodiment of the present invention.

Referring to FIG. 4, the semiconductor package 300 having the stack chip structure according to this exemplary embodiment of the present invention includes a substrate 80, a plurality of semiconductor chips 101, 102 and 103, a filling material 90, and a molding agent 95. The substrate 80 may include interconnection patterns. The plurality of semiconductor chips 101, 102 and 103 are vertically stacked. Each of the semiconductor chips 101, 102 and 103 includes a first surface and a second surface, and includes align patterns 51a, 51b, 52a, 52b, 53a and 53b formed on the first surface and/or the second surface. Here, the align patterns 51a, 51b, 52a, 52b, 53a and 53b may be formed of a magnetic material. The filling material 90 fills a gap between the semiconductor chips. The molding agent 95 fills a space on the substrate 80 and seals the package.

Further, third align patterns 55b formed corresponding to the first or second align patterns of the lowermost semiconductor chip 101 may be formed on the substrate 80.

TSVs 21, 22 and 23 adjacent each other in a vertical direction are bonded by ball bumps (not shown) and stacked. Thus, the semiconductor chips 101, 102 and 103 form a semiconductor chip module. The lowermost semiconductor chip 101 among the plurality of semiconductor chips 101, 102 and 103 are bonded and mounted on the substrate 80 by bumps 85. Electrical connection between the semiconductor chips 101, 102 and 103 and between the lowermost semiconductor chip 101 and the substrate 80 is achieved by ball bumps (not shown).

The filling material 90 fills a gap between the substrate 80 and the semiconductor chips 101, 102 and 103 stacked on the substrate 80. For example, the filling material 90 may be a material which shields a magnetic field. In this case, an influence by a magnetic field due to the align patterns may be minimized.

The semiconductor package 300 may further include a redistribution film (not shown) coupled to the TSV 21 of the lowermost semiconductor chip 101, and an insulation layer (not shown) formed to expose a portion of the redistribution film. In this case, an insulation layer exposing the TSV of the lowermost semiconductor chip and an external coupling member formed by the redistribution film exposed by the insulation layer may be further formed between the lowermost semiconductor chip and the redistribution film. In addition, a semiconductor chip 104 including fourth align patterns 54a corresponding to the second align patterns 53b may be further formed on the uppermost semiconductor chip among the plurality of semiconductor chips.

Since the others are substantially identical to this exemplary embodiment of FIG. 3, a detailed description thereof will be omitted.

FIGS. 5 to 10 are cross-sectional views illustrating a method for manufacturing a semiconductor package according to another exemplary embodiment of the present invention. In FIGS. 5 to 10, a semiconductor chip includes TSVs and align patterns on both surfaces thereof.

Figure 5:
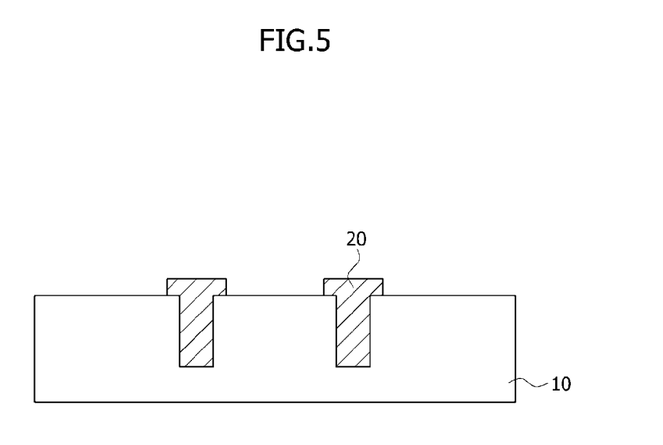
FIGS. 5 to 10 are cross-sectional views illustrating a method for manufacturing a semiconductor package having a stack chip structure according to another exemplary embodiment of the present invention.

Referring to FIG. 5, vertical holes are formed in regions adjacent to bonding pads (not shown) of each chip at a wafer (10) level. Here, the wafer 10 is in such a state that a back grinding is not performed thereon. Thus, the vertical holes are formed in a groove structure, not a through-hole structure. An insulation layer (not shown) is formed on the surfaces of the vertical holes. The insulation layer (not shown) is formed in order for insulation between the wafer 10 and a conductive metal layer which fills the vertical holes.

TSVs 20 are formed by filling the vertical holes, in which the insulation layer is formed. The TSVs 20 are coupled so that electric signals can be transmitted and received by bonding pads (not shown) of the chip and patterned conductive lines. For example, the TSVs 20 may be formed of conductive material, e.g., a metal. The metal may include copper (Cu), aluminum (Al), or tungsten (W).

Figure 6:
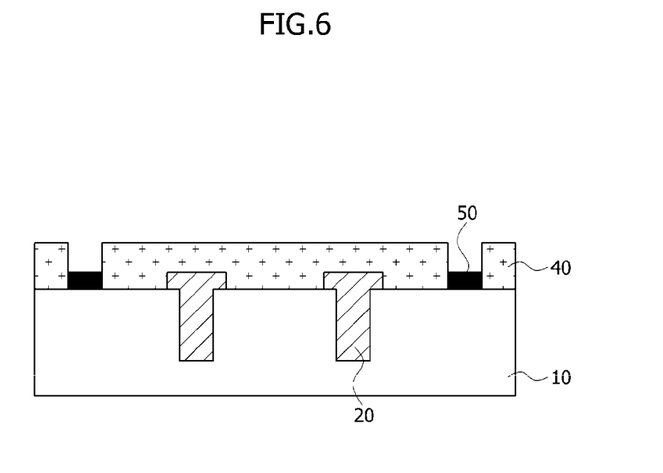

Referring to FIG. 6, a mask pattern 40 for forming align layers is formed on the resulting structure in which the TSVs 20 are formed. The mask pattern 40 may be formed of a photoresist. Here, the mask pattern 40 may be formed through a photoresist coating process, an exposure process, and a development process. The mask pattern 40 is formed to expose a region in which align patterns are to be formed. The align patterns may be formed in regions where circuit patterns or TSVs are not formed, for example, scribe lanes.

A magnetic material is formed to a certain thickness on the front side of the wafer exposed by the mask pattern 40, thereby forming align patterns 50a. The align patterns 50a may be formed by depositing a magnetic material through a sputtering process, or may be formed by coating a mixture of a magnetic micro ball and an adhesive through a screen printing process. The align patterns 50a may be formed in various shapes in regions where the TSVs or the circuit patterns are not formed.

Figure 7:
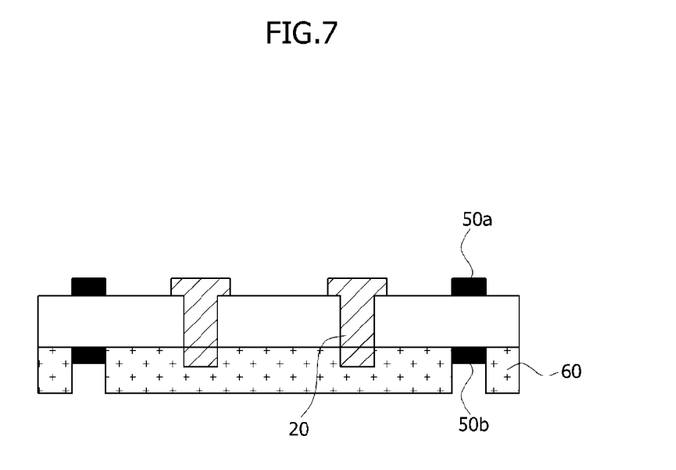

Referring to FIG. 7, the mask pattern is removed, and the back side of the wafer 10 is ground to an intended chip thickness. For example, the back side of the wafer 10 is ground until the TSVs 20 are exposed. Thus, in the fabrication of the stack package, the plurality of chips may be electrically connected and stacked by contacting the TSVs 20.

Figure 8:
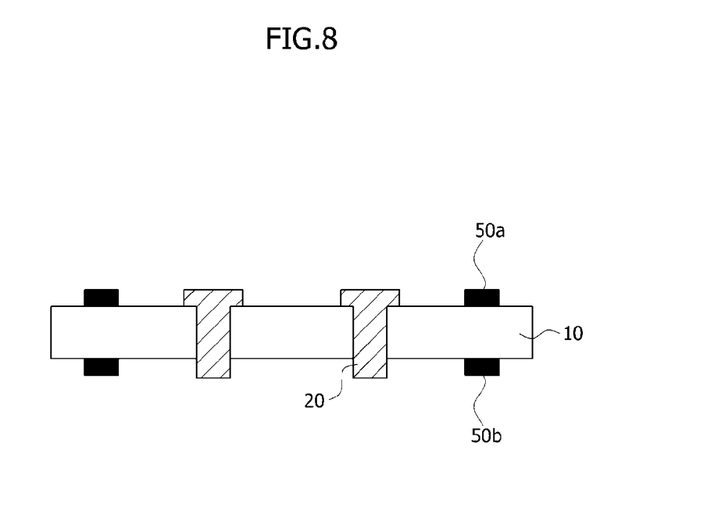

Referring to FIG. 8, like the front side of the wafer 10, align patterns 50b are formed on the back side of the wafer 10. Specifically, a mask pattern 60 exposing a region where align patterns are to be formed is formed on the back side of the wafer 10. The mask pattern 60 may be formed through a photoresist coating process, an exposure process, and a development process. A magnetic material is formed to a certain thickness in the back side region of the wafer 10 exposed by the mask pattern 60, thereby forming align patterns 50b. The align patterns 50b may be formed in the same manner as the align patterns 50a formed on the front side of the wafer 10. That is, the align patterns 50b may be formed by depositing a magnetic material through a sputtering process, or may be formed by coating a mixture of a magnetic micro ball and an adhesive through a screen printing process. Meanwhile, if the chips are stacked vertically, the align patterns 50b formed on the back side of the wafer 10 may be formed to have an opposite polarity to the align patterns 50a formed on the front side of the wafer 10 in order to cause an attraction force to be applied by the magnetic material between the align patterns of the upper and lower stacked chips to thereby achieve an easy alignment.

Figure 9:
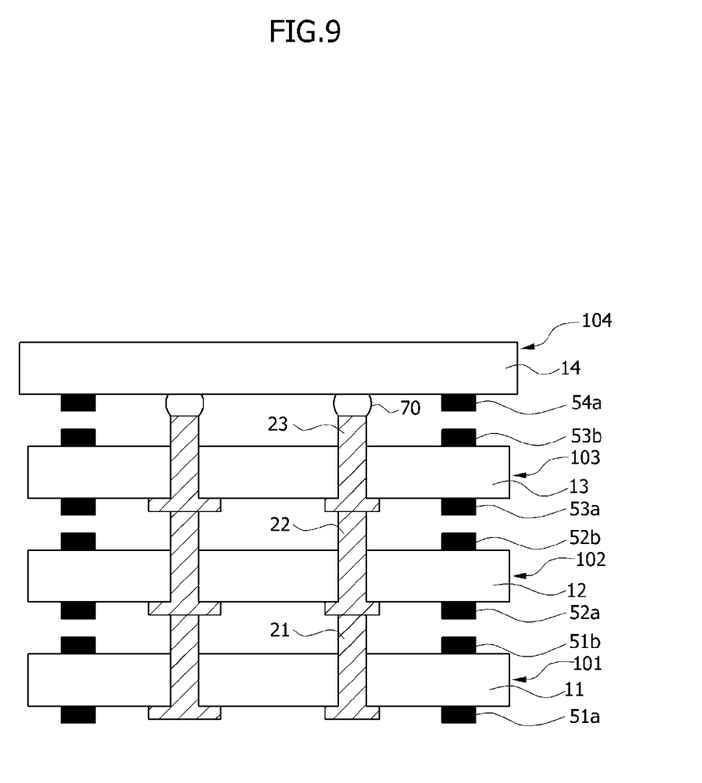

Referring to FIG. 9, when the mask layer formed on the back side of the wafer is removed, the align patterns 50a and 50b having opposite polarities are formed on the front side and the back side of the wafer in which the TSVs 20 are formed. The wafer is sawed into individual chips. Two or more chips are vertically stacked so that signals can be transmitted and received through the TSVs. Here, since the align patterns 50a and 50b formed of magnetic materials having opposite polarities are formed on the front side and the back side of the wafer, the chips may be stacked so that the TSVs are exactly aligned by the magnetic force between the align patterns of the vertically stacked chips.

The uppermost chip 104 among the vertically stacked chips may be a system IC, a controller, or other passive elements. In some cases, the uppermost chip 104 may not be a semiconductor chip. In this case, the align patterns are formed so that they are exactly aligned by the attractive force during stacking the chips, by forming the align patterns facing each other to have opposite polarities to each other.

Figure 10:
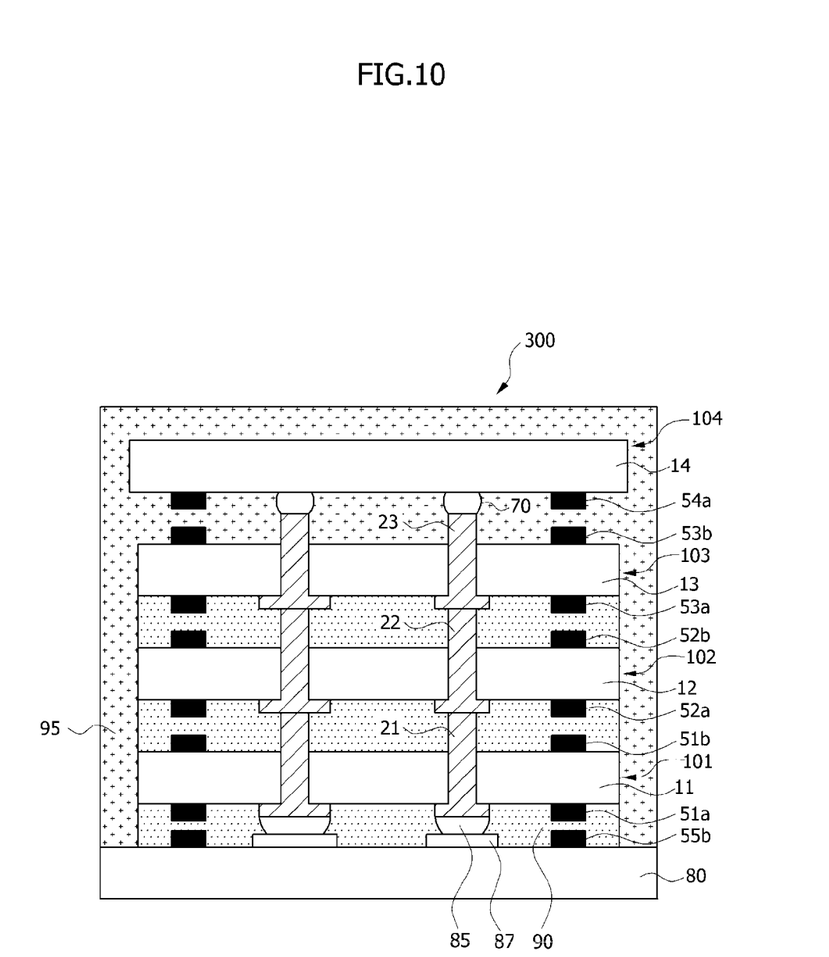

Referring to FIG. 10, after the plurality of chips are stacked, a filling process is performed so that a filling material 90 fills an empty space between the chips. Further, an empty space on the substrate 80 is sealed with a molding agent 95. In this manner, the packaging is completed. In general, misalignment may be caused by a pressure applied when the filling material 90 fills the empty space between the chips. However, according to the exemplary embodiment of the present invention, since the magnetic force is applied between the align patterns formed on the chips, the bonding strength is reinforced. Hence, the misalignment may decrease during the filling process of the filling material.

Meanwhile, a magnetic force is generated around the align patterns formed of the magnetic material. If such a magnetic force influences the driving of the chip, the portion where the align patterns are formed may be cut and removed after the chips are vertically stacked. In this case, the align patterns may be formed on the scribe lanes of the wafer. The scribe lanes are regions where patterns which are not practically used in a device such as an align key are formed and then cut when the wafer is cut into the individual chips after a wafer level fabrication process is completed. Thus, even though the align patterns are removed after the chip stacking is completed, the operation of the device is not influenced.

In order that the chip driving is not influenced by the magnetic field formed by the align patterns, a magnetic field shielding material may be used as the filling material 90 filling the empty space between the stacked chips. In this case, regions except for the regions where the align patterns are formed may be filled with the magnetic field shielding material, or the empty space between the stacked chips may be filled with the magnetic fielding shielding material after the chip alignment is completed.

According to the exemplary embodiments of the present invention, the align patterns formed of magnetic materials having opposite polarities are formed on the top and bottom of the semiconductor chip. Thus, when the plurality of chips are stacked on the substrate in order for the packaging, the semiconductor chips may be exactly aligned by the magnetic force between the align patterns of the vertically stacked chips. In addition, when filling the space between the chips, the alignment may not be influenced by the bonding force between the align patterns.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor chip comprising:
   a semiconductor substrate having a first surface and a second surface, wherein a circuit pattern including a bonding pad is formed on the first surface;
   a first align pattern formed on the first surface of the semiconductor substrate, wherein the first align pattern is formed of a magnetic material;
   a through-silicon via (TSV) passing through the semiconductor substrate; and
   a scribe lane on at least one side of the semiconductor substrate, wherein the circuit pattern and the through-silicon via are not formed in the scribe lane,
   wherein the first align pattern is formed in the scribed lane.

2. The semiconductor chip of claim 1, further comprising a second align pattern formed on the second surface of the semiconductor substrate in correspondence to the first align pattern, wherein the second align pattern is formed of a magnetic material.

3. The semiconductor chip of claim 2, wherein the first align pattern and the second align pattern have opposite polarities to each other.

4. The semiconductor chip of claim 2, wherein the first align pattern and the second align pattern are formed in plurality and arranged symmetrically to each other.

5. A semiconductor package comprising:
   a plurality of stacked semiconductor chips; and
   a filling material filling a gap between the semiconductor chips, wherein each of the plurality of stacked semiconductor chips comprises:
      a semiconductor substrate having a first surface and a second surface,
   wherein a circuit pattern including a bonding pad is formed on the first surface; and
      a first align pattern formed on the first surface of the semiconductor substrate, wherein the first align pattern is formed of a magnetic material,
   wherein the filling material comprises a magnetic field shielding material.

6. The semiconductor package of claim 5, further comprising a second align pattern formed on the second surface of each of the semiconductor chips in correspondence to the first align pattern, wherein the second align pattern is formed of a magnetic material.

7. The semiconductor package of claim 6, wherein the first align pattern and the second align pattern of each of the semiconductor chips have opposite polarities to each other.

8. The semiconductor package of claim 5, further comprising:
   a through-silicon via (TSV) passing through the semiconductor substrate of each of the semiconductor chips.

9. The semiconductor package of claim 8, wherein the first align pattern of each of the semiconductor chips is formed in a region where the circuit pattern and the through-silicon via are not formed.

10. The semiconductor package of claim 9, further comprising a scribe lane on at least one side of the semiconductor substrate of each of the semiconductor chips, wherein the first align pattern is formed on the scribed lane.

11. The semiconductor package of claim 6, further comprising an interconnection formed on the lowermost semiconductor chip among the plurality of semiconductor chips and electrically connected to the plurality of semiconductor chips.

12. The semiconductor package of claim 11, further comprising a third align pattern formed on the semiconductor substrate in correspondence to the second align pattern of the lowermost semiconductor chip among the plurality of semiconductor chips.

13. The semiconductor package of claim 8, further comprising:
   a redistribution film formed on the second surface of the lowermost semiconductor chip among the plurality of semiconductor chips and coupled to the TSV of the lowermost semiconductor chip; and
   an insulation layer exposing a portion of the redistribution film.

14. The semiconductor package of claim 13, further comprising:
   an insulation layer formed between the second surface of the lowermost semiconductor chip and the redistribution film and exposing the TSV of the lowermost semiconductor chip.

15. The semiconductor package of claim 5, further comprising a semiconductor chip formed on the uppermost semiconductor chip among the plurality of semiconductor chips, wherein the semiconductor chip comprises a fourth align pattern corresponding to the second align pattern of the uppermost semiconductor chip.

* * * * *